United States Patent [19]

Kimura et al.

[11] Patent Number: 4,599,737
[45] Date of Patent: Jul. 8, 1986

[54] X-RAY MASK WITH Ni PATTERN

[75] Inventors: Takeshi Kimura, Higashimurayama; Hidehito Obayashi, Nerima; Kozo Mochiji, Tachikawa, all of Japan

[73] Assignee: Hitachi, Ltd., Tokyo, Japan

[21] Appl. No.: 529,710

[22] Filed: Sep. 6, 1983

[30] Foreign Application Priority Data

Sep. 16, 1982 [JP] Japan ................. 57-159653

[51] Int. Cl.⁴ .................. G03F 1/00; G21K 5/00
[52] U.S. Cl. ............................... 378/35; 430/5
[58] Field of Search ................. 430/5; 378/35

[56] References Cited

U.S. PATENT DOCUMENTS 3,443,915  5/1969  Wood et al. .................. 430/5
3,642,476  2/1972  Mesley ........................ 430/5

FOREIGN PATENT DOCUMENTS 0046228  4/1981  Japan ........................ 430/5
0091234  7/1981  Japan ........................ 430/5
0060839  4/1982  Japan ........................ 430/5

*Primary Examiner*—Richard L. Schilling
*Attorney, Agent, or Firm*—Antonelli, Terry & Wands

[57] ABSTRACT

An X-ray mask having a mask pattern formed from nickel or a material having nickel as a principal component supported on a thin membrane. The X-ray mask has characteristics substantially equal to those of the conventional X-ray mask employing Au as a mask pattern and is much lower in price than the Au-containing mask pattern. In addition, since the X-ray mask can easily be formed by electroless plating, it is possible to form a mask pattern with a higher accuracy than that in case of employing Au alone.

17 Claims, 6 Drawing Figures

X-RAY MASK WITH Ni PATTERN

BACKGROUND OF THE INVENTION

1. Field of the Invention

The present invention relates to a mask (X-ray mask) employed in X-ray lithography and more particularly to an X-ray mask making it possible to form a minute pattern having a high contrast that is suitable especially for manufacture of various semiconductor devices having a high density of integrated circuits.

2. Description of the Prior Art

As is generally known, X-ray lithography is a technique to replicate a pattern onto an object to be processed by selectively irradiating the object with X-rays through an X-ray mask.

The X-ray mask generally has a cross-sectional structure as shown in FIG. 1 of the accompanying drawings and includes a membrane 2 having a high permeability to X-rays that is secured by a ringshaped support frame 1 (usually made of Si), and a mask pattern 3 that is formed on the membrane 2 and made of a material having a low permeability to X-rays; i.e., a high linear absorption coefficient.

An object to be processed is placed on one side of the X-ray mask, and X-rays are applied from the other side. Thereby, a pattern having a shape corresponding to the mask pattern 3 is replicated; i.e., duplicated, onto the object.

To form the membrane 2 of the X-ray mask, it is possible to employ a large variety of organic or inorganic materials; e.g., polyimide, Si, BN, $Si_3N_4$ or $SiO_2$. In addition, it is possible to employ a single-layer or laminated membrane made of one or more of these materials.

On the other hand, as the material for the mask pattern 3, Au (gold) is generally employed.

The reasons for employing gold are that gold has a higher linear absorption coefficient (a low permeability) with respect to X-rays, that gold is chemically stable and exhibits a long life and that it is easy to form a film from gold by vacuum deposition or plating.

Since gold is expensive, however, the X-ray mask employing this metal is inevitably expensive, which constitutes one of serious obstacles to a wider application of the X-ray lithography in the manufacture of semiconductor devices.

SUMMARY OF THE INVENTION

Accordingly, a primary object of the invention is to provide an X-ray mask which is low in cost while having the above-mentioned advantages of the mask pattern made of gold, thereby solving the above-mentioned problem of the prior art.

To this end, according to the invention, there is provided an X-ray mask having a mask pattern that is formed from a single-layer film made of Ni (nickel) or a material having nickel as a principal component (more than 50 mol. %), or that is formed from a multi-layer film including the single-layer film.

DETAILED DESCRIPTION OF THE PREFERRED EMBODIMENTS

It is desirable for the wavelength of X-rays employed in X-ray lithography to be shorter in order to improve the penetrability of the X-rays through the membrane of an X-ray mask; whereas it is desirable for the wavelength to be longer in order to increase the absorption of the X-rays by the mask pattern 3 and an X-ray resist.

For satisfying both the above-mentioned requirements, the wavelength of the X-rays employed is generally selected within a region from several Å to several tens of Å; i.e., from 5 to 50 Å. The linear absorption coefficients of several metals with respect to X-rays having wavelengths within this region were measured to obtain the results shown in FIG. 2.

Figure 2:
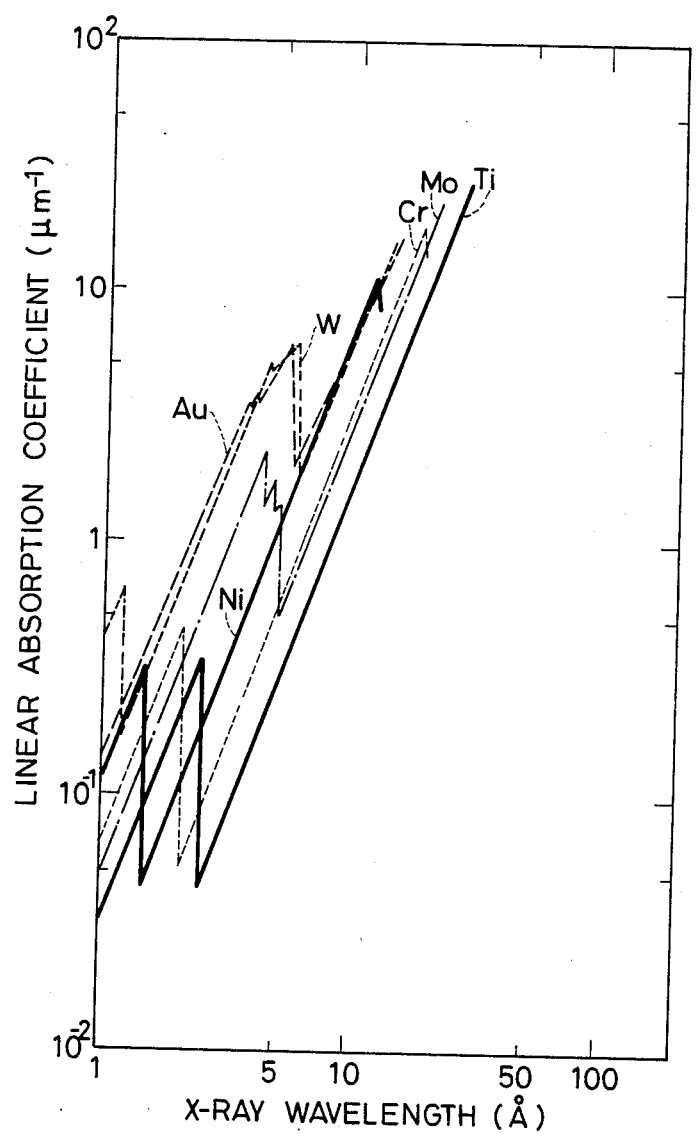
FIG. 2 is a chart showing the dependence of the linear absorption coefficient of several kinds of metal on the wavelength.

As will be clear from FIG. 2, the wavelength-linear absorption characteristic of W is close to that of Au. From this point of view, W can be employed for producing the mask pattern of an X-ray mask in place of Au.

However, disadvantageously, the W film formed by evaporation has an extremely large residual stress. In addition, there is no practical plating method for forming a W film.

Mo shows a higher linear absorption coefficient than that of Ni, Cr and Ti in the wavelength region below about 5 Å. Mo, however, has a noticeable absorption edge near a wavelength of 5 Å, and the linear absorption coefficient of Mo in the wavelength region larger than about 5 Å is smaller than that of Ni and Cr. Therefore, Mo is not very advantageous for the whole wavelength region employed in X-ray lithography.

On the other hand, Ni has no absorption edge in a wavelength region from 1.5 Å to 12 Å and still has a linear absorption coefficient equal to that of Au and W in a wavelength region from about 6 Å to about 13 Å.

In addition, Ni is, as a matter of course, easily formed by evaporation, and it is possible to form a film of nickel more easily than of gold by employing a plating process. In other words, it is difficult to form an Au film by electroless plating, and it is necessary to deposit a ground metal film beforehand in such a case. In the case of Ni, however, it is easy to form a film by electroless plating without providing any ground metal film.

Moreover, since a fine oxide layer is formed on the surface simply by exposing Ni to an ordinary atmosphere, such as air and the like, the mask pattern made of Ni is chemically stable and exhibits a long life. Thus, it has been made clear that Ni has many advantages as an X-ray mask material.

The price of Ni, needless to say, is far lower than that of Au. Therefore, if a Ni film is employed as a mask pattern, it is possible to form an X-ray mask much more useful than the conventional X-ray masks.

It is to be noted that the absorption edge wavelengths of Ni are 12.22 Å, 14.2 Å, 14.5 Å and so forth, while the absorption edge wavelengths of Au are 3.936 Å, 4.518 Å, 5.374 Å, and so forth.

Accordingly, the wavelength region where the linear absorption coefficients of Au and Ni are equal to each other is precisely from 5.374 Å to 12.2 Å.

EXAMPLE 1

A plurality of Si wafers, each having one ground surface, were prepared and the following four kinds of substrates were formed: (1) a substrate having a polyimide film of 2 μm thickness deposited on the ground surface of the Si wafer; (2) a substrate having an $Si_3N_4$ film of 0.1 μm thickness formed on the ground surface of the Si wafer and a polycrystalline Si film of 1 μm thickness laminated thereon; (3) a substrate having an $Si_3N_4$ film of 0.1 μm thickness formed on the ground surface of the Si wafer and a BN film of 2 μm thickness laminated thereon by CVD (Chemical Vapor Deposition); and (4) a substrate having a BN film of 2 μm thickness formed on the ground surface of the Si wafer.

A resist film (ex., AZ1350J; Shipley Company Inc.) having a thickness of 2 μm was applied to the whole surface of each of the substrates, and a resist pattern of at least 0.5 μm line width was formed by the known 1/10 reducing projection method and electron beam lithography. It is to be noted that the reverse side of each substrate was covered with the abovementioned resist film so that the Si surface would not be exposed.

Next, the substrate surfaces were activated by a mixed solution of tin chloride and palladium chloride. After rinsing, the substrates were dipped in an electroless plating solution having nickel sulfate and sodium citrate as principal components to carry out plating under 80° C.±10° C. It is to be noted that ammonium sulfate and sodium hydrogenhypophosphite were added to the plating solution in order to control the pH thereof.

An Ni film was formed on the whole surface of each substrate by the electroless plating treatment. The film thickness of the Ni film obtained can be controlled so as to be a desired value by varying the plating time. For example, if plating is carried out for 30 minutes to two hours, then the Ni film thickness can be controlled in a range between 0.5 and 1.5 μm.

If the resist pattern, together with the Ni film deposited thereon, is removed, the Ni film deposited directly on the substrate surface is left. As a result, a mask pattern provided by the Ni film is formed.

Figure 1:
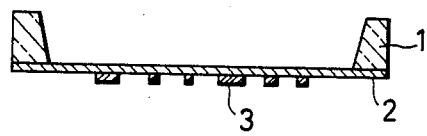
FIG. 1 shows a cross-sectional view of one embodiment of the structure of an X-ray mask.

When the Si wafer is selectively etched from the reverse side thereof to remove Si on a desired portion, an X-ray mask is formed which has a support frame 1 made up of the remaining Si wafer, the membrane 2 and the mask pattern 3 made up of the Ni film, as shown in FIG. 1 in cross section.

In this example, four kinds of membranes were formed as the membrane 2, as mentioned above, and mask patterns of the Ni films were formed on these membranes. It was possible to form the mask patterns without any problem.

In addition, although the Ni films were formed by what is called the "lift-off method" in this example, methods other than the lift-off method are available.

More specifically, if the resist pattern is formed after the surface of the membrane deposited on the Si wafer is activated by the mixed solution of tin chloride and palladium chloride, the resist pattern is not activated.

Therefore, if the electroless plating is carried out after this activation treatment, Ni will not be deposited on the resist pattern, but Ni will selectively be deposited on the exposed surface of the membrane to form a mask pattern.

Thus, a mask pattern is formed with a higher accuracy than that in case of forming the mask pattern by the lift-off method.

The formation of a mask pattern by electroless plating has no need for a ground conductor layer under the Ni film. Therefore, the throwing power is excellent, and the residual stress of the obtained film is small. In addition, the dimensional accuracy is high. Accordingly, it is possible to form an extremely excellent X-ray mask.

It is to be noted that in the case where the mask pattern is formed from not Ni solely, but a plurality of materials having Ni as a principal component, it is only necessary to dissolve these materials into the plating solution beforehand.

For example, in case of forming an Ni-W mask pattern, it can be formed simply by dissolving a desired amount of sodium tungstate into an electroless plating solution including nickel sulfate.

EXAMPLE 2

A plurality of X-ray masks were formed according to the method described in Example 1, which masks have polyimide films of 2 μm thickness as membranes formed on surfaces of respective Si wafers and mask patterns, formed thereon, constituted by Ni films different in thickness from each other.

Through these X-ray masks, resist (PMMA: Poly-Methyl Methacylate) films disposed at the rear of the respective X-ray masks were irradiated with Al-K rays having a wavelength of 8.34 Å and then developed. The remaining thickness ratio (the ratio in thickness between the remaining resist film on the portion shielded by the Ni film and the remaining resist film on the portion not shielded) of each resist pattern obtained was measured to obtain the results shown in FIG. 3.

For comparison, the result obtained in case of employing an Au film of 0.6 μm thickness in place of the Ni film is also shown by a broken line.

Figure 3:
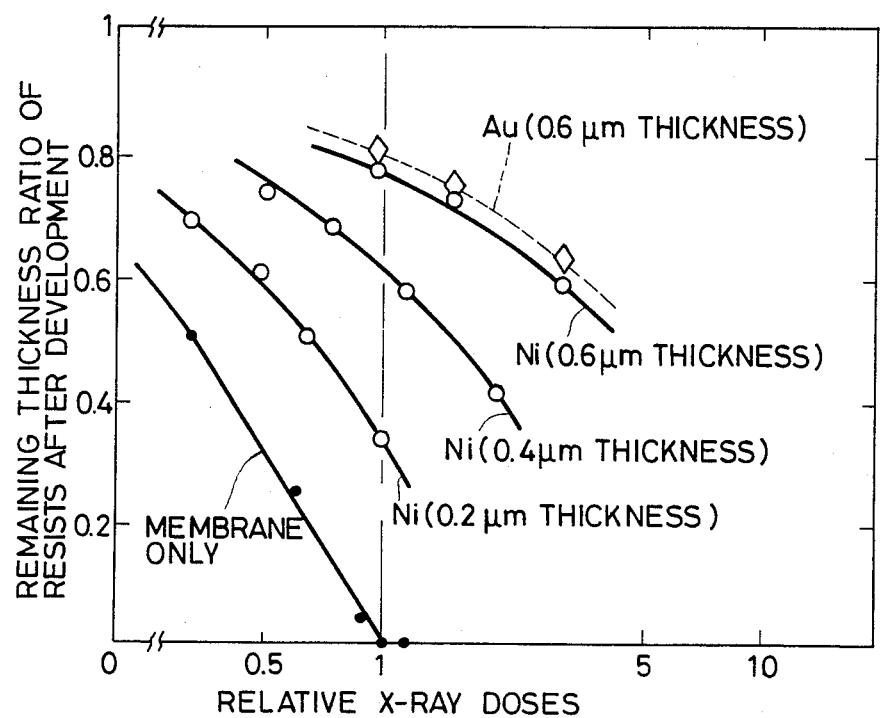
FIGS. 3 to 6 are graphical representations of data for describing the advantageous effects of the invention, respectively.

As will be obvious from FIG. 3, as the Ni film thickness becomes larger, the remaining thickness ratio of the resist pattern obtained becomes larger, so that the contrast is improved. Moreover, if the film thicknesses are the same, Ni makes it possible to obtain a contrast substantially equal to that in the case of Au. Therefore, it has been confirmed that Ni can satisfactorily be employed instead of Au, which is higher in price than Ni.

EXAMPLE 3

It is also possible to obtain a high contrast similar to that in the case where Ni is solely employed, as shown in Example 2, by employing an intermetallic compound having Ni as a principal component.

Figure 4:
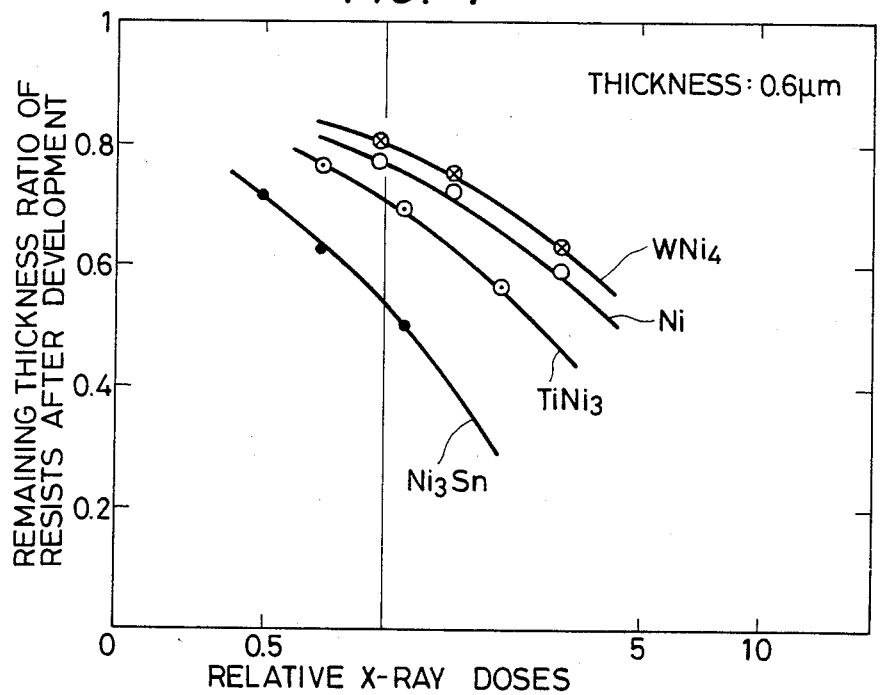

Resist patterns were formed by employing mask patterns constituted by $Ni_3Sn$, $TiNi_3$ and $WNi_4$ films of 0.6 μm thickness, respectively, in the similar manner to that in Example 2. The remaining thickness ratio of each resist pattern after development was measured to obtain the results shown in FIG. 4. For comparison, the result obtained in case of employing an Ni film equal in film thickness to the above is also shown in FIG. 4.

Since the mass absorption coefficient of Sn with respect to Al-K rays is small, the contrast obtained when $Ni_3Sn$ is employed is lower than the contrasts obtained when other intermetallic compounds are employed. However, the mask pattern formed from the $Ni_3Sn$ has a contrast high enough to be put into practical use.

It is a matter of course that it is possible to obtain a similarly high contrast by not only employing a mask pattern constituted by a single layer film made of an intermetallic compound including Ni but also forming a mask pattern by laminating other metal films on the Ni film. In addition, the mask pattern can also be put into practical use if the Ni film includes a small amount (less than 1 wt.%) of other elements, such as cobalt and the like, such as Fe, Si, Cu, Bi, Cr, Pd and so on.

EXAMPLE 4

Figure 5:
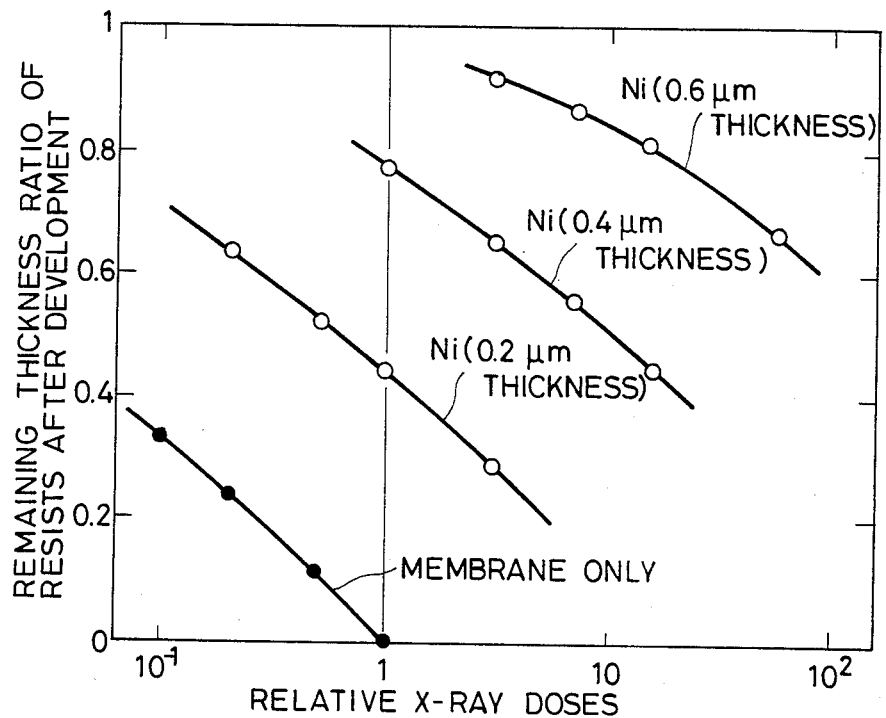

FIG. 5 shows the relationship between the X-ray doses in the case where Ni film patterns of various thicknesses are irradiated with a characteristic X-ray having a wavelength of 12.13 Å generated from an Ne gas plasma and the remaining thickness ratio of positive type resists after development. As will be apparent from FIG. 5, it has been demonstrated that if a Ni film of 0.4 $\mu$m thickness is employed, the amount of the X-ray reaching the resist film is decreased to substantially 1/5 of that in case of employing no Ni film, and it is possible to obtain a contrast value of 5. Contrast value is defined as a thickness ratio of resist dissolved by development between exposures without and with a Ni film.

EXAMPLE 5

One of the problems concerning the mask preparation in the semiconductor lithographic process is the mask defect density. One of the main factors in the mask defect is the attachment of dust to the mask, and the dust is generally removed by spraying an organic solvent or conducting an ultrasonic cleaning in an organic solvent.

Figure 6:
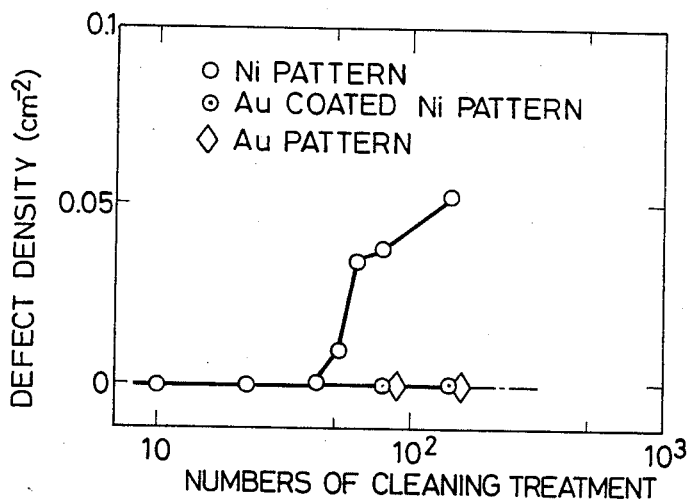

In the X-ray mask, the corrosion of the mask pattern due to the organic solvent cleaning and the exfoliation of the mask pattern due to the corrosion may increase the mask defect, resulting in the reduction of the mask life. FIG. 6 shows the results of investigation of the relationship between the numbers of cleaning treatment and the mask defect density in the case wherein the cleaning organic solvents, Tricrene, acetone and alcohol are employed, and an ultrasonic cleaning is carried out with each solvent for five minutes, and thereafter, the mask patterns are dried in an $N_2$ atmosphere of 150° C. for ten minutes. From the results, the following has been found; namely, when Ni is solely employed as a mask pattern forming material, as compared with the mask employing Au, the defect density increases when the number of times of cleaning treatment is above 50. However, even when the number of times of cleaning treatment is 100, the defect density is only on the order of 0.05 defects/cm$^2$, which shows that the Ni film pattern can sufficiently be put into practical use. In addition, if an Au film having a thickness of 500 Å is deposited on the upper and side surfaces of the Ni film pattern, it can have a life equal to that of a mask pattern formed from Au solely, as shown in FIG. 6.

EXAMPLE 6

According to the method shown in Example 1, a resist film was formed all over the polyimide film formed on each of Si wafers, and a resist pattern was formed in the same manner as that in Example 1 after the surface of the resist film was made hydrophobic.

Then, the substrate surface was activated in the same manner as that in Example 1. Since the resist surface was hydrophobic as mentioned above, however, the resist surface was not activated, but only the exposed surface of the polyimide film was activated.

Therefore, when electroless plating of Ni was carried out under this state, the Ni was selectively deposited on the surface of the activated polyimide film but was not deposited on the resist film, so that a mask pattern was formed without employing the lift-off method.

Although various methods are available for making the resist hydrophobic, such a method may be employed that a resist conventionally employed; e.g., a positive-type novolak resist (trade name: AZ1350J, made by Shippley) is applied and then brought into contact with a plasma including F, such as $CF_4$ and the like.

If a resist having a hydrophobic nature in itself is employed, as a matter of course, the resist can be used as it is, without any need for such a treatment for making the resist hydrophobic.

The film thickness range of the mask patterns capable of being used in the invention, needless to say, differs depending on the wavelength and energy of the X-rays employed. It is, however, preferable that the film thickness of mask patterns formed from Ni films should be within a range between about 0.4 and about 2 $\mu$m under conditions generally employed. A mask pattern film thickness smaller than about 0.4 $\mu$m lowers the contrast to make it difficult to form an excellent resist pattern. On the other hand, a mask pattern film thickness larger than about 2 $\mu$m makes it difficult to highly accurately form a mask pattern having an excellent cross-sectional configuration in the case where the pattern width dimension is in the submicron region, for example.

In the case where a mask pattern is constituted by a single-layer film made of an intermetallic compound including Ni or a laminated film of an Ni film and other materials, it is only required to correct the film thickness range in the case of an Ni film only according to the Ni content of the mask pattern and the X-ray absorption coefficient of other material employed.

Although the membrane is, as a matter of course, required to have a mechanical strength sufficient for stably holding the mask pattern formed thereon, if the film thickness of the membrane is excessively large, the amount of transmitted X-ray is decreased to make the X-ray exposure duration longer.

For this reason, the film thickness of the membrane is selected to fall between about 2 and about 10 $\mu$m, although the range slightly differs depending on the material for the membrane.

As will be fully understood from the foregoing description, the X-ray mask in accordance with the invention is much lower in price than the conventional X-ray mask employing an Au film as a mask pattern for absorbing X-rays as well as can obtain a contrast substantially equal to that obtained by the conventional X-ray mask with respect to X-rays having wavelengths of about 5 Å to about 13 Å.

In addition, the life of the mask from the viewpoint of the defect density is satisfactory in practical use. Moreover, although it is difficult to form a mask pattern from Au by employing electroless plating, it is easy to form a mask pattern from Ni by electroless plating, so that a mask pattern constituted by an Ni film can easily be formed with an extremely high accuracy.

What is claimed is:

1. An X-ray mask having a membrane of an X-ray transmitting material formed on an annular support frame, and a mask pattern of an X-ray absorbing material formed on said membrane, wherein said mask pattern consists of at least one layer, said at least one layer including at least a layer formed from a material consisting of nickel, or a material having nickel as a principal component, said at least a layer having a thickness such that said at least a layer acts as said X-ray absorbing material of said mask pattern.

2. An X-ray mask according to claim 1, wherein said mask pattern is formed from the material consisting of nickel and has a film thickness of about 0.4 to about 2 μm.

3. An X-ray mask according to claim 1, wherein said support frame is made essentially of silicon.

4. An X-ray mask according to claim 3, wherein said mask pattern is formed from a material consisting essentially of nickel and has a film thickness of about 0.4 to 2 μm.

5. An X-ray mask having a membrane of an X-ray transmitting material formed on an annular support frame, and a mask pattern of an X-ray absorbing material formed on said membrane, wherein said mask pattern includes at least one layer, said at least one layer including at least a layer formed from a material consisting essentially of nickel, or a material having at least one intermetallic compound of nickel, such that said at least a layer acts as said X-ray absorbing material.

6. An X-ray mask according to claim 5, wherein said intermetallic compound is selected from the group consisting of $Ni_3Sn$, $TiNi_3$ and $WNi_4$.

7. An X-ray mask according to claim 1, wherein said mask pattern is a laminated film constituted by a nickel layer and a layer formed from another material.

8. An X-ray mask according to claim 1, wherein said membrane is a single-layer or laminated film formed from at least one kind of material selected from the group consisting of polyimide, Si, $SiO_2$, BN and $Si_3N_4$.

9. An X-ray mask according to claim 1, wherein said material having nickel has more than 50 mol % Ni.

10. An X-ray mask according to claim 1, wherein said at least a layer formed from a material consisting of Ni or a material having Ni as a principal component is formed by electrolessly depositing said at least a layer.

11. An X-ray mask according to claim 10, wherein said at least a layer is selectively electrolessly deposited on exposed portions of the membrane to thereby form said mask pattern.

12. An X-ray mask according to claim 1, wherein said at least a layer is formed from a material consisting of nickel.

13. An X-ray mask according to claim 1, wherein said mask pattern is formed from a material consisting of nickel.

14. An X-ray mask according to claim 1, wherein said mask pattern is formed from said material having nickel as a principal component.

15. An X-ray mask according to claim 14, wherein said material having nickel has more than 50 mol % Ni.

16. An X-ray mask having a membrane of an X-ray transmitting material formed on an annular support frame, and a mask pattern of an X-ray absorbing material formed on said membrane, wherein said mask pattern includes at least one layer, said at least one layer including at least a layer formed from a material consisting essentially of nickel, or a material having nickel as a principal component, said at least a layer not containing gold, such that said at least a layer acts as said X-ray absorbing material.

17. An X-ray mask having a membrane of an X-ray transmitting material formed on an annular support frame, and a mask pattern of an X-ray absorbing material formed on said membrane, wherein said mask pattern includes at least one layer, said at least one layer including at least a layer formed from a material consisting essentially of nickel, or a material having nickel as a principal component, said mask pattern not containing gold, such that said at least a layer acts as said X-ray absorbing material.

* * * * *